United States Patent [19]
MacElwee

[11] Patent Number: 5,296,726
[45] Date of Patent: Mar. 22, 1994

[54] HIGH VALUE RESISTIVE LOAD FOR AN INTEGRATED CIRCUIT

[75] Inventor: Thomas W. MacElwee, Nepean, Canada

[73] Assignee: Northern Telecom Limited, Montreal, Canada

[21] Appl. No.: 41,378

[22] Filed: Apr. 1, 1993

[51] Int. Cl.$^5$ .............................. H01L 27/02
[52] U.S. Cl. .................... 257/213; 257/350; 257/358; 257/359; 257/380; 257/538; 257/904
[58] Field of Search .............. 251/350, 358, 359, 380, 251/393, 538, 904

[56] References Cited

U.S. PATENT DOCUMENTS 4,504,743  3/1985  Aoyama et al. .................. 257/393
5,013,678  5/1991  Winnerl et al. ................... 437/52
5,047,826  9/1991  Keller et al. ...................... 357/42

*Primary Examiner*—Edward Wojciechowicz
*Attorney, Agent, or Firm*—Angela de Wilton

[57] ABSTRACT

A linear and symmetrical gigaohm resistive load structure for an integrated circuit is implemented using a thin film accumulation mode MOSFET configured as a split gate symmetrically off device. Preferably, the resistive load structure comprises two thin film accumulation mode field effect transistors connected in series with a common node and separate gate electrodes. The thin film devices are provided with undoped or lightly doped polysilicon channel regions to provide a desired gigaohm resistance value. By connecting each of the two gate electrodes to the respective source terminals, a two terminal gigaohm resistor structure is produced in which one of the devices is always in the high impedance OFF state regardless of the terminal voltages. The split gate structure allows the integration of the device with minimal metallization interconnect and only two terminals.

16 Claims, 2 Drawing Sheets

HIGH VALUE RESISTIVE LOAD FOR AN INTEGRATED CIRCUIT

FIELD OF THE INVENTION

This invention relates to a high value resistive load for an integrated circuit, with particular application to gigaohm load resistors for bipolar CMOS integrated circuits.

BACKGROUND OF THE INVENTION

Highly resistive loads are required in various applications for VLSI digital and analogue integrated circuits. For example, gigaohm resistors may be used as pull-up resistors in memory devices to limit power consumption.

In a known method of providing a linear resistor for a MOS, Bipolar, or Bipolar CMOS (BiCMOS) silicon integrated circuit, a layer of polysilicon is deposited over a thick layer of dielectric, for example, a field oxide provided on a semiconductor silicon substrate. The polysilicon layer is patterned to define a resistor structure and then selectively doped by ion implantation. Typically, the polysilicon resistor structure comprises heavily doped end regions forming ohmic contact electrodes, and a resistive region extending between the contact regions in which the dopant concentration is sufficient to provide a desired resistance value. Low and medium valued resistors for applications in MOS and bipolar digital and analogue integrated circuits (ICs), are typically formed by adjusting the resistivity by selectively doping the layer of polysilicon, e.g. by ion implantation, to obtain n- or p-type ohmic resistors. Advantageously a polysilicon resistor structure can be completely isolated by a layer of dielectric, e.g. silicon dioxide, to reduce potential shunting of the resistor by parasitic current leakage paths. Resistors as described above having low to medium resistance value ranges (i.e. 10–1000 ohm/sq) are linear over a wide voltage range.

Polysilicon resistors may be implemented in any of the four or five layers of polysilicon commonly used in CMOS or BiCMOS processes. For example, as described in U.S. Pat. No. 5,013,678 to Winnerl et. al. entitled "Method of making an integrated circuit comprising load resistors arranged on the field oxide zones which separate the active transistor zones", resistors are formed in a polysilicon layer which forms gate structures of MOS transistors. In another example, described in European Patent Application 0316104A to Hunt et. al. entitled Improvements in Integrated Circuits, a common polysilicon layer is used to provide polysilicon resistors and polysilicon emitters of bipolar transistors.

Amorphous silicon may be used as an alternative to polysilicon, for example as described in a U.S. Pat. No. 047,826 to Keller et. al. entitled "Gigaohm load resistor for BICMOS process" a gigaohm resistor is fabricated from a layer of 1500Å to 2500Å of CVD or sputtered amorphous silicon, heaving heavily doped O+ or N+ head regions which are silicided to form contacts. The resistivity of the amorphous silicon layer is adjusted by ion implantation and is independent of the polysilicon layers forming the gate of CMOS transistors, emitters of bipolar transistors or first capacitor plates. In the latter example, the amorphous silicon layer also formed a second plate of a capacitor or a fuse.

Although highly value resistive loads in the 100kΩ range may be fabricated reproducibly using conventional CMOS and bipolar CMOS processes, a number of problems arise in using known processes for fabricating gigaohm resistive loads using undoped or very lightly doped polysilicon. The latter is susceptible to process induced damage and defects, which degrade quality, create leakage paths and lead to poor reliability. Non-linearity of conventional known high value polysilicon resistors has restricted use of gigaohm resistors to the leakage current type circuit applications, for example, in high density static random access memories (SRAMS).

In fabricating high value resistances from polysilicon with sheet resistance in excess of megaohm/sq charges are found to be associated with isolating dielectrics, typically deposited oxides, and traps may be generated due to etch damage or exposure of the dielectric to plasma radiation. These charges and traps tend to cause surface conduction modulation in the underlying polysilicon layer and create leakage paths, resulting in resistance degradation. Thus polysilicon and amorphous silicon gigaohm resistors formed as described above, are susceptible to processing or radiation induced surface charges and defects, which may result in highly non-linear current voltage characteristics and significant die-to-die and wafer-to-wafer sheet resistance variability. Resistor performance may be unsatisfactory for analogue circuit designs where gigaohm resistors are required having high linearity and symmetric current-voltage (I-V) characteristics.

SUMMARY OF THE INVENTION

The present invention seeks to provide a highly resistive load and a method of forming a highly resistive load for an integrated circuit in which the above mentioned problems are avoided or reduced.

Thus according to one aspect of the present invention there is a highly resistive load for an integrated circuit formed on a semiconductor substrate, comprising a highly resistive semiconductor layer of a first conductivity type isolated from the semiconductor substrate by a first dielectric layer; the high resistivity semiconductor layer having defined therein heavily doped regions of said first conductivity type forming first and second source regions and a common drain region of a pair of field effect transistors coupled in series, the high resistivity semiconductor layer forming first and second resistive channel regions between the common drain region and the first and second source regions respectively, an overlying second dielectric layer; a second conductive layer defining first and second gate electrodes overlying the first and second channel regions respectively, the gate electrodes being isolated from each other and from the channel regions by the second dielectric layer; means for holding each gate electrode to a respective adjacent source voltage to maintain a zero source-gate voltage for biasing the transistor into a subthreshold, high impedance, "off" state; first and second contacts of the resistive load structure provided to the heavily doped source regions, whereby the coupled transistors are operable together in accumulation mode as a symmetrically 'off' state device presenting a highly resistive load between contacts to respective first and second source regions.

Thus a highly resistive load is provided by a split gate shielded resistor structure which is equivalent to a pair of distinct accumulation mode thin film field effect transistors with individual gate, source and drain connections coupled in series. By connecting each of the two gate electrodes to respective source terminals, a two terminal gigaohm resistor structure is produced in which one of the transistors is always biased into the subthreshold, high impedance, OFF state, regardless of the terminal voltages. The split gate configuration allows for integration of the device into CMOS, bipolar or BiCMOS integrated circuits with minimal metallization interconnect and only two terminals.

In a preferred structure, a linear and symmetrical gigaohm resistor is implemented using a symmetrical gated and shielded polysilicon resistor structure, which is equivalent to integrating two thin film accumulation mode MOSFET transistors connected in series with a common drain node and with separate gate electrodes. Thus the current voltage characteristics of the device are symmetrical.

Furthermore, during fabrication of the integrated circuit, the conductive layer forming the gate electrodes functions to shield the underlying high resistivity polysilicon from process induced damage during subsequent processing steps.

According to another aspect of the present invention, there is provided an integrated circuit formed on a semiconductor substrate having a highly resistive load comprising: a high resistivity semiconductor layer of a first conductivity type isolated from the semiconductor substrate by a first dielectric layer; the high resistivity semiconductor layer having defined therein heavily doped regions of said first conductivity type forming first and second source regions and a common drain region of first and second coupled MOS field effect transistors, the high resistivity semiconductor layer forming first and second resistive channel regions between the common drain region and the first and second source regions respectively; an overlying second dielectric layer; a conductive layer overlying the second dielectric layer and defining first and second gate electrodes overlying the first and second channel regions and isolated therefrom by the second dielectric layer; conductive means connecting the first and second gate electrodes to the respective first and second source regions to hold the gate to source voltage at zero, for biasing the transistor into a subthreshold high impedance state whereby the coupled transistors are operable together as a symmetrically "off" state device presenting a highly resistive load between contacts to first and second source regions.

Conveniently, when the resistive load is fabricated from polysilicon, polysilicon forming a gigaohm resistor may be part of layers of polysilicon forming other device structures, such as gates of MOS transistors or emitters of bipolar transistors.

According to yet a further aspect of the present invention there is provided A highly resistive load for a bipolar CMOS integrated circuit formed on a semiconductor substrate comprising: first and second accumulation mode thin film MOS FET transistors defined in a highly resistive semiconductor layer isolated from the semiconductor substrate, the transistors being coupled in series, each transistor having a resistively conductive channel region and a source region, and a common drain region; first and second terminal contacts being provided to the source of the respective first and second transistors, and each transistor having an isolated gate electrode tied to the respective source for holding the gate-source voltage at zero, for biasing the transistor into a subthreshold "off" state having a high impedance, the pair of coupled transistors being operable to provide a symmetrically OFF state device characterized by a high threshold voltage, a large subthreshold slope thereby providing a high resistance load between first and second terminal contacts which is linear over a bias range of +1.5V to −1.5V.

A high value resistor structure may be integrated o into a bipolar CMOS process using conventional processing steps, for example, with a resistor body and gate electrodes being fabricated from the conductive layers, e.g. polysilicon layers, forming gate or emitter structures respectively of CMOS and bipolar transistors, and/or capacitor electrodes.

Thus the present invention provides a highly resistive load structure for an integrated circuit, an integrated circuit comprising a highly resistive load and a method of forming an integrated circuit having a highly resistive load structure, in which the above mentioned problems are avoided or reduced.

BRIEF DESCRIPTION OF THE DRAWINGS

Embodiments of the invention will now be described by way of example, with reference to the accompanying drawings, in which.

DESCRIPTION OF THE PREFERRED EMBODIMENT

Figure 1:
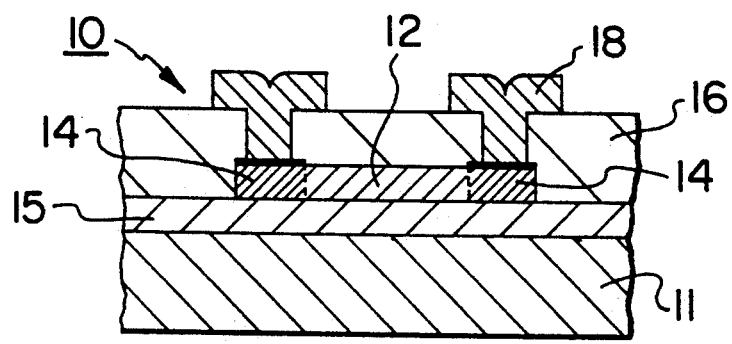
FIG. 1 shows a schematic diagram of a conventional known type of resistor structure for an integrated circuit.

A conventional known type of resistor 10 for an integrated circuit (IC) is shown schematically in FIG. 1. The resistor 10 comprises a body formed from a resistively conductive layer of polysilicon which is lightly p doped or n doped to provide a resistive region 12 having a resistivity in a desired range. End regions 14 of the resistor body are more heavily doped, n+ or p+, to form ohmic contact regions. The polysilicon body is isolated from the substrate 11 by a layer of dielectric material 15, e.g. a field oxide region, and a layer of a conventional dielectric 16, typically silicon dioxide surrounds the resistor body. Conductive terminals 18 are provided to the end contact regions 14 by a conventional metallization process which, for example, may include silicidation of the heavily doped end contact regions 14.

However, when the polysilicon is undoped or very lightly doped to provide high value resistors (>1MΩ/square), process induced charges in the isolating dielectric layer 16 may be sufficient to induce modulate conduction of the resistive region 12, leading to leakage by surface conduction effects. In very high resistance, e.g. gigaohm resistors of a conventional structure, the surface conduction and hence the terminal resistance may be modified significantly due to process induced charging of the surface. Thus, resistivities in excess of 1MΩ/ square are difficult to achieve reliably in a resistor of this structure and significant die-to-die and batch-to-batch resistivity variation may occur.

Figure 2:
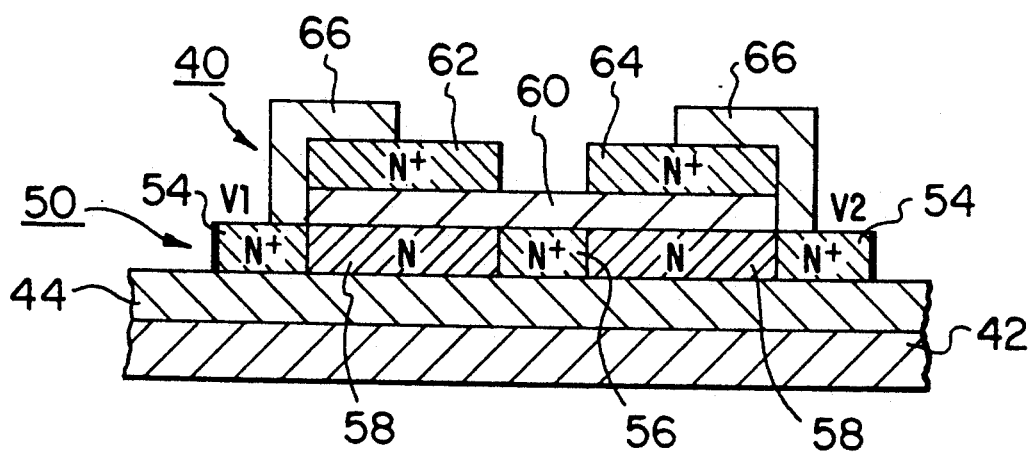
FIG. 2 shows a schematic cross sectional view through a high value resistive load structure according to a first embodiment of the present invention.

A high value resistive load structure 40 for an integrated circuit according to an embodiment of the present invention is shown in FIG. 2. The resistive load structure 40 is formed from a resistively conductive layer 50 of undoped or very lightly doped polysilicon of a desired high resistivity. The conductive layer 50 is isolated from the substrate 42 by an underlying isolation layer 44, for example, a field isolation layer, typically silicon dioxide. The polysilicon layer 50 is patterned to define a resistor body 50, and is selectively doped by ion implantation to form heavily doped N+ regions 54 and a heavily doped N+ region 56, which function as source/drain regions as will be described below, leaving relatively lightly doped resistive regions 58 of the layer 50 extending as resistive channels between the N+ regions. In a bipolar CMOS integrated circuit, the polysilicon layer 50 may, as an example, be the same as that forming the gate electrodes of MOS transistors, an emitter polysilicon layer, or a capacitor polysilicon layer. A dielectric layer 60 is formed over the polysilicon layer 50. The dielectric layer 60 may be formed by a conventional method, for example, of a layer of silicon dioxide which also forms the gate oxide layer of MOS transistors. However, the dielectric layer 60 is typically thicker than a conventional gate oxide, for example 1000Å or more, for reasons to be explained below. A second conductive layer, for example doped polysilicon, is deposited and patterned to define first and second gate electrodes 62 and 64, overlying the first and second resistive portions 58 of the first polysilicon layer 50. Subsequently, contacts are formed through the dielectric layer 60 to the N+ end contact regions 54. Conductive interconnect 66 is provided so that the gate electrodes 62 and 64 are connected to the respective end contact regions 54 as shown schematically in FIG. 2. Subsequently, contact metallization is formed, for example, by conventional CMOS process steps. The resulting resistive load structure 40 is physically and electrically symmetrical about the common node 56.

Figure 3:
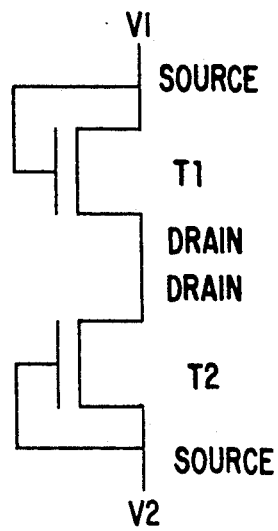
FIG. 3 shows an equivalent circuit implementation of the structure of FIG. 2.

The highly resistive load structure 40 is equivalent to a pair of accumulation mode MOS field effect transistors coupled in series, as represented in FIG. 3. Each transistor comprises the resistive region 52 forming a o resistively conductive channel 58, a heavily doped region 4 forming a source, with the two transistors connected in series through the heavily doped region 56 forming a common drain. Each device has its gate 62, or 64, tied to the respective source 54 for holding the gate-source voltage at zero, i.e. $V_{gs}=0$, to minimize surface conduction effects. As shown in FIG. 2, the preferred structural implementation of the two devices connected in series is as a merged device, with a common drain node 56, to minimize layout and interconnect requirements. Thus, there is provided resistive load structure comprising a split gate thin film accumulation mode MOS FET having N+ first and second source regions, an N channel and an isolated common N+ drain node. The gate electrodes are connected to the respective N+ source regions 54 which form the resistor terminals. The split gate device structure is structurally symmetrical about the common drain node 56.

In an accumulation mode N channel MOS transistor as described above, comprising a doped N type body with N+ source and drain regions, conduction can occur not only at the surface, but also in the body of the N type layer forming the channel. Thus, the accumulation mode device is less susceptible to surface charge effects than an enhancement mode device. For example, in an n channel enhancement mode transistor consisting of a p type body an inversion layer formed at the surface of the device controls conduction and is therefore more susceptible to conductance modulation caused by induced surfaces charges resulting from process induced damage and defects.

Thus, the operation of the highly resistive load 40 is described as follows: considering the resistive load of FIG. 2 as the equivalent two thin film accumulation mode N channel MOS transistors of FIG. 3, with sources and drains as marked, the purpose of the gate electrodes 62 and 64 (FIG. 2) is to control the surface conduction component, by electrostatically pinning the surface potential, which effectively fixes the degree of Surface conduction under the gate electrode. From MOSFET theory, surface conduction is minimized by holding the gate to source voltage at zero (i.e. $V_{gs}=0$ volts), which may be accomplished simply by connecting the gate electrode of each transistor to the respective source terminal of the device by local interconnect conductor 66 as shown in FIG. 3. Current through a device remains small provided the drain terminal is maintained positive with respect to the source terminal. If the drain is allowed to become negative with respect to the source, the roles of "source" and "drain" are interchanged. If the gate is connected to the drain electrode, in this configuration $V_{gs}=V_{ds}$, and the device is biased in a saturated region and the current increases dramatically with bias placing the device in a low resistance state. This results in a high degree of asymmetry in the operation of each device, with a high impedance device so long as the drain voltage $V_{ds}$ is positive. However, as shown in FIGS. 2 and 3, a resistive load which is independent on the polarity of the applied voltage, and has a symmetrical current voltage (I - V) response, is obtained using a back-to-back device arrangement using two similar polysilicon thin film accumulation mode transistors structures, each with its gate tied to its respective source to provide a symmetrical device structure.

Figure 4:
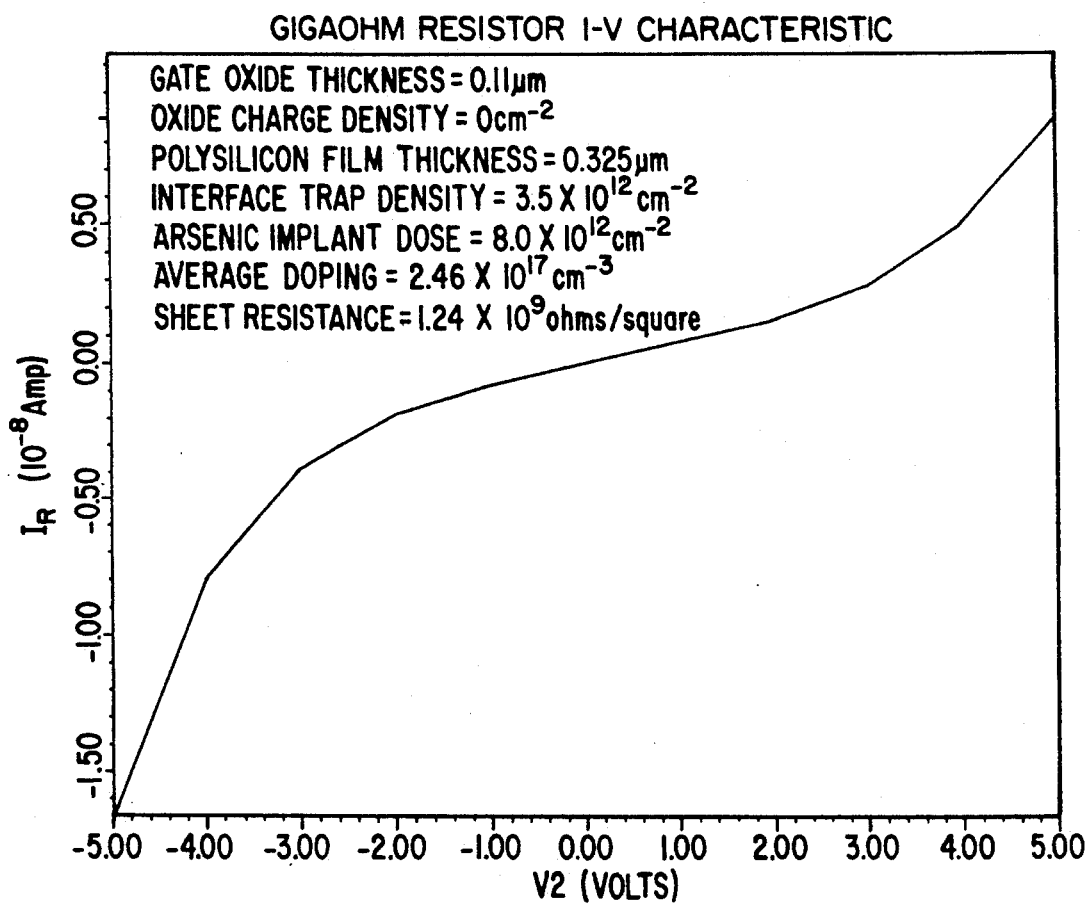
FIG. 4 shows a typical current voltage (I-V) characteristic of a highly resistive load structure according to the first embodiment.

Referring to FIG. 3, when V1 is positive with respect to V2, T1 is configured with the gate tied to the effective drain since it is at a higher potential than the common node. This biases T1 into the saturated region of operation Vgs=Vds which is a low impedance state. T2 on the other hand is biased with the gate tied to the source and is in the subthreshold, or OFF, state resulting in a high impedance condition. Since the two devices are in series, the resulting impedance state is high. If now V1 is made negative with respect to V2 the situation is exactly the same except that the relative biases of T1 and T2 are reversed. Thus a structure with a symmetrical I-V characteristic and a high terminal resistance is obtained (FIG. 4).

Furthermore, during fabrication of the integrated circuit, the polysilicon gate electrodes also functions to shield the surface of the resistor body, i.e. of the resistive channel 52, from ionization by radiation and other process induced charging effects which may occur during processing.

Thus the resistive load provided by the accumulation mode MOSFET devices described has reduced sensitivity to fabrication effects. Control of the surface potential during operation is improved compared with a conventional known high value polysilicon resistor structures.

Preferably the structure is formed so that each of the elements equivalent to a thin film accumulation mode MOS transistor has characteristics which include a large turn on or threshold voltage. The device must be biased off with the gate tied to the source. The subthreshold slope is made as large as practical. To achieve this and keep the surface component of conduction modulation to a minimum, a relatively thick gate oxide is used, as described above. The effect of increasing the gate oxide thickness is to reduce the capacitative coupling of the gate electrode to the surface thereby increasing the threshold voltage and subthreshold slope characteristics simultaneously. Thus, preferably, the gate oxide thickness is for example, 1000Å or more (see example I) to achieve a high threshold voltage, e.g $\geq 7V$.

EXAMPLE I

| | |
|---|---|
| first polysilicon layer thickness | 0.325 μm |
| gate oxide thickness | 1100 Å |
| resistor channel doping | N type $2 \times 10^{17}$ cm$^{-3}$ arsenic |
| source/drain doping | N+ type $1 \times 10^{20}$ cm$^{-3}$ arsenic |
| Characteristics: | |
| threshold voltage | 7 V |
| subthreshold slope | 1500 mV/decade |

In a method of providing high value resistive loads for a bipolar CMOS (BiCMOS) integrated circuit according to the embodiment of the present invention, a polysilicon gigaohm resistor structures is formed in a BiCMOS process as follows. A p-type, <100> Si substrate wafer is processed through conventional steps up to gate polysilicon deposition. As an example, this would typically comprise formation of N and P type buried layers, epitaxial silicon deposition, N and P well formation, growth of 700 nm of field oxide, MOS gate oxide formation, and 0.32 μm gate polysilicon deposition. A matrix of low dose blanket arsenic implants into the polysilicon layer is performed. A thin oxide layer is then formed, followed by and a masking step (i.e coating with photoresist and patterning) to define and protect a gigaohm resistor region from a blanket N+ polysilicon gate implant. The latter implant is required to form low resistivity polysilicon gate electrodes. After resist strip and an RCA clean, the gate polysilicon layer is selectively thermally oxidized to form a capacitor dielectric, as well as part of the gigaohm polysilicon resistor. Deposition of another layer of 0.32 μm polysilicon, blanket N+ implant, and lithography are used to define an analog capacitor top electrode. The second polysilicon layer also forms a hard mask for the gigaohm resistor structure. The hard mask is ablated during the gate polysilicon etch process, which in this process is performed after the capacitor polysilicon PE. Hence after both gate and capacitor polysilicon layers are etched, the gigaohm resistor region remains masked by the dielectric layer which reduces etch damage to the polysilicon resistor surface during subsequent processing. Bipolar transistor base regions and MOS transistor LDD regions are then formed. Formation of a 80 nm base oxide, followed by high temperature annealing by rapid thermal processing in nitrogen at 1050 C., provides a shielding dielectric layer. Another layer of polysilicon is deposited, i.e. a layer of 0.32 μm emitter polysilicon, which also caps the resistive channel of the resistor structure and is patterned to define the gate electrodes of the resistor structure. The latter polysilicon layer acts as a resistor shield for all subsequent oxide and metal deposition and etch steps, all of which include exposure of the resistor structure to a plasma ambient. A conventional three level metal interconnect is used to complete the structure and provides contacts to end regions of the resistor structure. Sintering at 450° C. for 30 minutes in 100% H$_2$ concludes the process.

The resistive load structure of the embodiment using parameters as shown in Example I provided a resistance of 6 Gigaohm/sq for a 2 square structure, and resistance was found to be linear over a bias range of −1.5 to +1.5V. Thus a high impedance, linear and symmetrical circuit resistor has been implemented using conventional CMOS and BiCMOS processing steps, which is applicable to analog and digital VLSI integrated circuits.

Although the embodiment describes an N channel device, resistive load structures may be fabricated with complimentary type conductivity structures, i.e. as P channel accumulation mode thin film transistor device. In other embodiments alternative well known dielectrics and conductive materials are used. For example, the high resistivity semiconductor layer is alternatively be formed from other suitable known materials. e.g. amorphous silicon Although a particular embodiment of the invention has been described in detail, it should be appreciated that numerous modifications, variations and adaptations may be made without departing from the scope of the invention as defined in the claims.

What is claimed is:

1. A highly resistive load for an integrated circuit formed on a semiconductor substrate, comprising
   a highly resistive semiconductor layer of a first conductivity type isolated from the semiconductor substrate by a first dielectric layer;
   the high resistivity semiconductor layer having defined therein heavily doped regions of said first conductivity type forming first and second source regions and a common drain region of a pair of field effect transistors coupled in series,
   the high resistivity semiconductor layer forming first and second resistive channel regions between the common drain region and the first and second source regions respectively,
   an overlying second dielectric layer;
   a second conductive layer defining first and second gate electrodes overlying the first and second channel regions respectively, the gate electrodes being isolated from each other and from the channel regions by the second dielectric layer;
   means for holding each gate electrode to a respective adjacent source voltage to maintain a zero source-gate voltage for biasing the transistor into a subthreshold, high impedance, "off" state;
   first and second contacts of the resistive load structure provided to the heavily doped source regions, whereby the coupled transistors are operable together in accumulation mode as a symmetrically 'off' state device presenting a highly resistive load between contacts to respective first and second source regions.

2. A structure according to claim 1 wherein the structure is electrically and structurally symmetrical about the common drain node.

3. A structure according to claim 1 wherein the highly resistive semiconductor layer comprises a layer of undoped polysilicon.

4. A structure according to claim 1 wherein the highly resistive semiconductor layer comprises a layer of lightly doped polysilicon.

5. A structure according to claim 1 wherein the D second dielectric layer is ≦1000Å thick to provide a threshold voltage ≦7V.

6. An bipolar CMOS integrated circuit formed on a semiconductor substrate and having a highly resistive load structure comprising:
- a high resistivity semiconductor layer of a first conductivity type isolated from the semiconductor substrate by a first dielectric layer;
- the high resistivity semiconductor layer having defined therein heavily doped regions of said first conductivity type forming first and second source regions and a common drain region of first and second coupled MOS field effect transistors, the high resistivity semiconductor layer forming first and second resistive channel regions between the common drain region and the first and second source regions respectively;
- an overlying second dielectric layer;
- a conductive layer overlying the second dielectric layer and defining first and second gate electrodes overlying the first and second channel regions and isolated therefrom by the second dielectric layer;
- conductive means connecting the first and second gate electrodes to the respective first and second source regions to hold the gate to source voltage at zero, for biasing the transistor into a subthreshold high impedance state whereby the coupled transistors are operable together as a symmetrically "off" state device presenting a highly resistive load between contacts to first and second source regions.

7. A integrated circuit according to claim 6 wherein the highly resistive semiconductor layer comprises part of a layer of polysilicon forming emitters of bipolar transistors.

8. A integrated circuit according to claim 6 wherein the highly resistive semiconductor layer comprises part of a layer of polysilicon forming gates of CMOS transistors.

9. A integrated circuit according to claim 6 wherein the first dielectric layer comprises a field isolation layer.

10. A highly resistive load for a bipolar CMOS integrated circuit formed on a semiconductor substrate comprising:
- first and second accumulation mode thin film MOS FET transistors defined in a highly resistive semiconductor layer isolated from the semiconductor substrate, the transistors being coupled in series, each transistor having a resistively conductive channel region and a source region, and a common drain region;
- first and second terminal contacts being provided to the source of the respective first and second transistors,
- and each transistor having an isolated gate electrode tied to the respective source for holding the gate-source voltage at zero, for biasing the transistor into a subthreshold "off" state having a high impedance,
- the pair of coupled transistors being operable to provide a symmetrically OFF state device characterized by a high threshold voltage, a large subthreshold slope thereby providing a high resistance load between first and second terminal contacts which is linear over a bias range of +1.5V to −1.5V.

11. A highly resistive load according to claim 10 wherein the coupled transistor device is symmetric about the common drain node.

12. A highly resistive load according to claim 10 wherein the threshold voltages of each transistor is ≦7V and the subthreshold slope is ≧1500 mV per decade.

13. A highly resistive load according to claim 10 wherein each transistor comprises a channel region defined in the highly resistive semiconductor layer of a first conductivity type,
- and respective source and drain regions are defined by heavily doped regions of the first conductivity type formed in the resistively conductive layer of polysilicon;
- an overlying second dielectric layer;
- a second conductive layer defining first and second gate electrodes overlying respective first and second resistive channel regions and isolated from the channel region by the second layer of dielectric,
- resistor contacts being provided to the first and second source regions;
- and, respective gate electrodes and source regions being electrically connected to hold Vgs = 0.

14. A structure according to claim 13 wherein the highly resistive semiconductor layer comprises a layer of polysilicon.

15. A structure according to claim 13 wherein the resistive channel regions are lightly doped N type and the source and drain regions are heavily doped N type.

16. A structure according to claim 13 wherein the first dielectric layers comprises a field isolation layer formed on the semiconductor substrate.

* * * * *